United States Patent
Inoue et al.

(10) Patent No.: US 6,838,766 B2
(45) Date of Patent: Jan. 4, 2005

(54) SEMICONDUCTOR DEVICE

(75) Inventors: Yasunori Inoue, Ogaki (JP); Isao Ogura, Ogaki (JP); Makoto Akizuki, Ogaki (JP); Atsushi Sakai, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 55 days.

(21) Appl. No.: 09/810,420

(22) Filed: Mar. 19, 2001

(65) Prior Publication Data

US 2001/0025993 A1 Oct. 4, 2001

(30) Foreign Application Priority Data

Mar. 21, 2000 (JP) ........................................ 2000-077933
Mar. 22, 2000 (JP) ........................................ 2000-079232

(51) Int. Cl.[7] .............................................. H01L 23/34
(52) U.S. Cl. ...................................... 257/724; 257/723
(58) Field of Search ................................ 257/723, 724, 257/528, 531, 532, 533, 71, 68, 360, 784

(56) References Cited

U.S. PATENT DOCUMENTS

| | | | |
|---|---|---|---|
| 3,668,551 A | * | 6/1972 | Kondo et al. |
| 3,864,817 A | * | 2/1975 | Lapham, Jr. et al. |
| 4,998,180 A | * | 3/1991 | McAuliffe et al. |
| 5,670,824 A | * | 9/1997 | Weinberg |
| 5,751,555 A | * | 5/1998 | Pfizenmayer et al. |
| 6,020,636 A | * | 2/2000 | Adishian |
| 6,078,514 A | * | 6/2000 | Takemae et al. |
| 6,369,662 B1 | * | 4/2002 | Haruta et al. |
| 6,424,034 B1 | * | 7/2002 | Ahn et al. |

FOREIGN PATENT DOCUMENTS

| | | |
|---|---|---|
| JP | 1-114003 | 5/1989 |
| JP | 5-190758 | 7/1993 |
| JP | 6-310311 | 11/1994 |
| JP | 7-135290 | 5/1995 |
| JP | 8-222730 | 8/1996 |
| JP | 9-186288 | 7/1997 |
| JP | 9-232505 | 9/1997 |
| JP | 9-275355 | 10/1997 |
| JP | 2736052 | 1/1998 |
| JP | 2752262 | 2/1998 |
| JP | 2845847 | 10/1998 |
| JP | 11-17052 | 1/1999 |
| JP | 11-145375 | 5/1999 |
| JP | 2942363 | 6/1999 |
| JP | 2958692 | 7/1999 |
| JP | 2970411 | 8/1999 |
| JP | 2000-12606 A | 1/2000 |

* cited by examiner

Primary Examiner—S. V. Clark
(74) Attorney, Agent, or Firm—McDermott Will & Emery LLP

(57) ABSTRACT

A semiconductor device capable of reducing a fabrication period as well as a fabrication cost when timing control for signal transmission is necessary is obtained. This semiconductor device comprises a first semiconductor chip consisting of at least either a circuit against static damage or a passive component. When a plurality of semiconductor chips installed on a support substrate are connected with each other through the first semiconductor chip, timing control for signal transmission is enabled by simply modifying the first semiconductor chip. In this case, the first semiconductor chip having a relatively simple structure can be modified in a shorter time at a lower cost as compared with a case of re-forming a semiconductor chip having an individual function. Thus, the modification period as well as the modification cost can be reduced when timing control for signal transmission is necessary.

18 Claims, 14 Drawing Sheets

SEMICONDUCTOR DEVICE

BACKGROUND OF THE INVENTION

1. Field of the Invention

The present invention relates to a semiconductor device, and more particularly, it relates to a semiconductor device having a plurality of semiconductor chips installed on a support substrate.

2. Description of the Background Art

A multi-chip module (MCM) systemized by packaging a plurality of semiconductor chips having different functions on an insulating substrate in high density to function as a single semiconductor device has recently been developed. Such a multi-chip module is disclosed in Japanese Patent Laying-Open No. 9-232505 (1997), for example.

FIG. 22 is a schematic diagram showing a conventional semiconductor device (multi-chip module). Referring to FIG. 22, a DRAM chip 201, a logic chip 202 and other functional chips 205 and 206 are installed on a support substrate 203 consisting of an insulating substrate in the conventional semiconductor device. A plurality of input/output terminals 203a are provided on the outer periphery of the surface of the support substrate 203 at prescribed intervals.

A plurality of input/output terminals 201a, 202a, 205a and 206a are provided on the upper surfaces of the DRAM chip 201, the logic chip 202 and the chips 205 and 206 respectively. The DRAM chip 201 and the logic chip 202 are directly connected with each other by connecting the input/output terminals 201a and 202a with each other by a plurality of wires 207.

The DRAM chip 201 is connected with the support substrate 203 by a plurality of wires 208, and the logic chip 202 is also connected with the support substrate 203 by a plurality of wires 209. The chip 205 is connected with the DRAM chip 201 by a plurality of wires 210, and the chip 206 is connected with the logic chip 202 and the support substrate 203 by a plurality of wires 211 and 212 respectively.

FIG. 23 is a circuit diagram showing the structure of an input/output circuit of each semiconductor chip in the conventional semiconductor device (multi-chip module) shown in FIG. 22. Referring to FIG. 23, a circuit against static damage consisting of static damage preventive transistors 301 and 302 is connected to every input/output terminal 201a (202a) of the DRAM chip 201 and the logic chip 202. The input/output terminal 201a (202a) is connected to an integrated circuit (not shown) in the chip through a resistor 303.

However, the aforementioned conventional semiconductor device (multi-chip module) may not function as a semiconductor device due to mismatched timing of signal transmission between the chips 201, 202, 205 and 206 even if operations of these chips are individually tested and recognized as non-defective. In this case, the design of any of the chips must be changed for re-forming the chip. In this case, high-priced masks of not more than 1 μm in precision must be re-formed, to result in a fabrication period of several weeks. Consequently, a long fabrication period is required for re-forming the chip, disadvantageously leading to a high fabrication cost.

In the aforementioned conventional semiconductor device, further, the static damage preventive transistors 301 and 302 are connected to every input/output terminal 201a (202a) of the DRAM chip 201 and the logic chip 202 as shown in FIG. 23, and a signal transmission rate between the chips is disadvantageously reduced due to parasitic capacitances of the static damage preventive transistors 301 and 302.

Further, the areas of the DRAM chip 201 and the logic chip 202 are disadvantageously increased due to the static damage preventive transistors 301 and 302 connected to every input/output terminal 201a (202a) of the DRAM chip 201 and the logic chip 202.

SUMMARY OF THE INVENTION

An object of the present invention is to provide a semiconductor device capable of reducing a fabrication period as well as a fabrication cost when timing control for signal transmission is necessary.

Another object of the present invention is to provide a semiconductor device capable of improving a signal transmission rate.

Still another object of the present invention is to reduce the area of a semiconductor chip in the aforementioned semiconductor device.

A semiconductor device according to an aspect of the present invention comprises a first semiconductor chip consisting of at least either a circuit against static damage or a passive component.

In the semiconductor device according to this aspect having the aforementioned structure, timing control for signal transmission is enabled by simply modifying the first semiconductor chip when a plurality of chips installed on a support substrate are connected with each other through the first semiconductor chip if the first semiconductor chip includes a passive component, for example. In this case, the first semiconductor chip including only a passive component or a circuit against static damage is simpler in structure as compared with the semiconductor chips having individual functions connected through the first semiconductor chip. Therefore, the first semiconductor chip can be modified in a shorter time at a lower cost as compared with a case of re-forming the semiconductor chips having individual functions. Consequently, the modification period as well as the modification cost can be reduced when timing control for signal transmission is necessary.

When the first semiconductor chip includes a circuit against static damage, no circuits against static damage may be provided in the individual semiconductor chips connected with each other but the circuit against static damage included in the first semiconductor chip can be employed as a common circuit against static damage for two semiconductor chips connected with each other. Thus, the number of circuits against static damage can be reduced, thereby reducing parasitic capacitances caused by the circuits against static damage. Thus, the signal transmission rate can be improved. Further, no circuits against static damage may be provided in the individual semiconductor chips connected with each other, whereby the areas of the individual semiconductor chips can be reduced. Consequently, the fabrication cost for the semiconductor chips connected with each other can also be reduced.

In the semiconductor device according to the aforementioned aspect, the passive component preferably includes at least one of a resistor, a capacitor and a reactor. Thus, timing control for signal transmission can be readily performed.

In the semiconductor device according to the aforementioned aspect, the first semiconductor chip preferably includes only a passive component. Thus, the structure of the first semiconductor chip is more simplified as compared with a first semiconductor chip including both of a passive component and a circuit against static damage. When timing control for signal transmission is necessary, therefore, the modification period as well as the modification cost for the first semiconductor chip can be more reduced.

In this case, the passive component preferably includes all of a resistor, a capacitor and a reactor. When timing control for signal transmission is necessary, therefore, a necessary passive component can be selected in response to the type of the signal.

The semiconductor device according to the aforementioned aspect preferably further comprises a second semiconductor chip and a third semiconductor chip installed on a support substrate, and the second semiconductor chip and the third semiconductor chip are preferably connected with each other through the first semiconductor chip. Thus, when timing control for signal transmission is necessary, the first semiconductor chip may simply be modified for enabling timing control for signal transmission if the first semiconductor chip includes a passive component, for example. In this case, the first semiconductor chip including only a passive component or a circuit against static damage is simpler in structure as compared with the second and third semiconductor chips having individual functions. When timing control for signal transmission is necessary, therefore, the first semiconductor chip can be modified in a shorter period at a lower cost as compared with a case of re-forming the second semiconductor chip or the third semiconductor chip. Consequently, the modification period as well as the modification cost can be reduced when timing control for signal transmission is necessary.

When the first semiconductor chip includes a circuit against static damage, no circuits against static damage may be provided in the second and third semiconductor chips but the circuit against static damage included in the first semiconductor chip can be employed as a common circuit against static damage for the second and third semiconductor chips. Thus, the number of circuits against static damage can be reduced, thereby reducing parasitic capacitances caused by the circuits against static damage. Therefore, the signal transmission rate between the second semiconductor chip and the third semiconductor chip can be improved. No circuits against static damage may be provided in the second and third semiconductor chips, whereby the areas of the second and third semiconductor chips can be reduced. Consequently, the fabrication cost for the second and third semiconductor chips can also be reduced.

In this case, the second semiconductor chip and the third semiconductor chip preferably include no circuits against static damage. Thus, the areas of the second and third semiconductor chips can be reduced. Consequently, the fabrication cost for the second and third semiconductor chips can also be reduced.

In this case, the second semiconductor chip is preferably a DRAM chip, and the third semiconductor chip is preferably a logic chip. In this case, the areas of the DRAM chip and the logic chip can be reduced. Consequently, the fabrication cost for the DRAM chip and the logic chip can also be reduced.

A semiconductor device according to another aspect of the present invention comprises a plurality of semiconductor chips installed on a support substrate, and a wire connecting the plurality of semiconductor chips with each other and having a passive component function.

In the semiconductor device according to this aspect, the signal transmission rate between the chips can be adjusted only through a wiring step after completion of the chips due to the aforementioned structure. Thus, the signal transmission rate between the chips can be adjusted without re-fabricating the semiconductor chips. Consequently, a modification period and a modification cost can be more reduced when timing control for signal transmission is necessary.

In the semiconductor device according to the aforementioned aspect, the wire having a passive component function preferably has a length greater than that for linearly connecting terminals of the plurality of semiconductor chips with each other thereby forming a resistive element. Thus, the signal transmission rate between the semiconductor chips can be readily adjusted.

The semiconductor device according to the aforementioned aspect preferably further comprises a dummy wire fixed to a prescribed potential and arranged to be opposed to the aforementioned wire at a prescribed interval, and the aforementioned wire is preferably combined with the dummy wire to form a capacitor. Thus, the signal transmission rate between the chips can be readily adjusted.

In the semiconductor device according to the aforementioned aspect, the wire is preferably formed either in a single layer or in two layers.

A semiconductor device according to still another aspect of the present invention has a plurality of semiconductor chips installed on a support substrate, and at least one of the semiconductor chips includes a first input/output terminal having a first circuit against static damage, a second input/output terminal having a second circuit against static damage, and a third input/output terminal other than the first input/output terminal and the second input/output terminal. The first input/output terminal is employed for testing an individual operating state of the semiconductor chip. The second input/output terminal is employed for connecting the semiconductor chip to the support substrate. The plurality of semiconductor chips are connected with each other through the third input/output terminal.

In the semiconductor device according to the aforementioned aspect, parasitic capacitances added to the first circuit against static damage provided on the first input/output terminal for testing and the second circuit against static damage provided on the second input/output terminal for connection with the support substrate can be eliminated when connecting the plurality of semiconductor chips with each other due to the aforementioned structure, whereby the signal transmission rate can be improved.

In the semiconductor device according to the aforementioned aspect, the third input/output terminal preferably includes no circuit against static damage. In this case, the semiconductor chips can be connected with each other through the third input/output terminal including no circuit against static damage. Thus, parasitic capacitances added to the circuits against static damage can be completely eliminated from the path between the semiconductor chips, whereby the signal transmission rate between the semiconductor chips can be improved. Electrostatic damage readily takes place in testing and after completion of the semiconductor device, and hence no significant problem arises also when the third input/output terminal other than the first and second input/output terminals for testing and connection with the support substrate includes no circuit against static damage. Further, no circuit against static damage is connected to the third input/output terminal as described above, whereby the areas of the semiconductor chips can be reduced. Thus, the fabrication cost for the semiconductor chips can also be reduced. In this case, the third input/output terminal preferably includes only a resistor.

In the semiconductor device according to the aforementioned aspect, the third input/output terminal preferably includes a third circuit against static damage, and a transistor forming the third circuit against static damage is preferably smaller than transistors forming the first and second circuits against static damage. When the transistor forming the third circuit against static damage of the third input/output terminal connecting the semiconductor chips hardly causing static damage is formed to have a smaller size than the transistors forming the first and second circuits against static damage for testing and connection with the support substrate readily causing static damage, a parasitic capacitance of the third circuit against static damage of the third input/output terminal connecting the semiconductor chips with each other can be reduced. Consequently, the signal transmission rate between the semiconductor chips can be improved. Further, the areas of the semiconductor chips can be reduced by reducing the size of the transistor forming the third circuit against static damage.

In this case, the gate width of the transistor forming the third circuit against static damage is preferably rendered smaller than the gate width of the transistors forming the first and second circuits against static damage. The parasitic capacitance of the third circuit against static damage can be readily reduced by rendering the gate width of the transistor forming the third circuit against static damage smaller than the gate width of the transistors forming the first and second circuits against static damage, whereby the signal transmission rate between the semiconductor chips can be improved.

In the semiconductor device according to the aforementioned aspect, the third input/output terminal preferably includes a third circuit against static damage, the third circuit against static damage is preferably formed by a diode, and the first and second circuits against static damage are preferably formed by transistors. When the third circuit against static damage of the third input/output terminal connecting the semiconductor chips hardly causing static damage is formed by a diode having a small parasitic capacitance and the first and second circuits against static damage for testing and connection with the support substrate readily causing static damage are formed by transistors having large parasitic capacitances, the parasitic capacitance of the third circuit against static damage of the third input/output terminal connecting the semiconductor chips can be reduced. Consequently, the signal transmission rate between the semiconductor chips can be improved. Further, the third circuit against static damage consisting of a diode has a smaller element area as compared with the first and second circuits against static damage consisting of transistors, whereby the areas of the semiconductor chips can be reduced. While the third circuit against static damage consisting of a diode has lower tolerance than the first and second circuits against static damage consisting of transistors, no problem arises since static damage hardly takes place between the semiconductor chips.

In the semiconductor device according to the aforementioned aspect, the plurality of semiconductor chips preferably include a DRAM chip and a logic chip.

A semiconductor device according to a further aspect of the present invention has a plurality of semiconductor chips installed on a support substrate, and at least one of the semiconductor chips includes a first input/output terminal and a second input/output terminal, a first circuit against static damage connected to the first input/output terminal, and switching means connected between the first input/output terminal and the first circuit against static damage and on-off controlled by the second input/output terminal.

The semiconductor device according to this aspect has the aforementioned structure, whereby the switching means on-off controlled by the second input/output terminal can be employed for turning on the circuit against static damage in a step of fabricating the semiconductor chips requiring a countermeasure against static damage while turning off the circuit against static damage after a chip connection step following completion of the chips requiring no countermeasure against static damage. Thus, a parasitic capacitance of the circuit against static damage can be eliminated after termination of the chip connection step, thereby improving a signal transmission rate.

In the semiconductor device according to the aforementioned aspect, the switching means is preferably set to an ON state by applying no voltage to the second input/output terminal during a step of fabricating the semiconductor chips and set to an OFF state by applying a prescribed voltage to the second input/output terminal after completion of a chip connection step following fabrication of the semiconductor chips. Thus, the switching means can be switched between ON and OFF states in the step of fabricating the semiconductor chips and after completion of the chip connection step by switching the voltage applied to the second input/output terminal.

In the semiconductor device according to the aforementioned aspect, the first circuit against static damage preferably includes first and second transistors, and the switching means preferably includes a third transistor and a fourth transistor. The third transistor is connected between the first transistor and the first input/output terminal, to enter an ON state when no voltage is applied to the second input/output terminal and enter an OFF state when the prescribed voltage is applied to the second input/output terminal. The fourth transistor is connected between the second transistor and the first input/output terminal, to enter an ON state when no voltage is applied to the second input/output terminal and enter an OFF state when the prescribed voltage is applied to the second input/output terminal. Thus, the third and fourth transistors are set to ON states by applying no voltage to the second input/output terminal in the step of fabricating the semiconductor chips, so that the circuit against static damage consisting of the first and second transistors can be set to an ON state. After completion of the chip connection step following fabrication of the semiconductor chips, the third and fourth transistors to OFF states by applying the prescribed voltage to the second input/output terminal, so that the circuit against static damage consisting of the first and second transistors can be set to an OFF.

In the semiconductor device according to the aforementioned aspect, a second circuit against static damage is preferably connected to the second input/output terminal. Thus, the second input/output terminal can be prevented from static damage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

A semiconductor device according to a first embodiment of the present invention is now described with reference to FIGS. 1 and 2.

Figure 1:
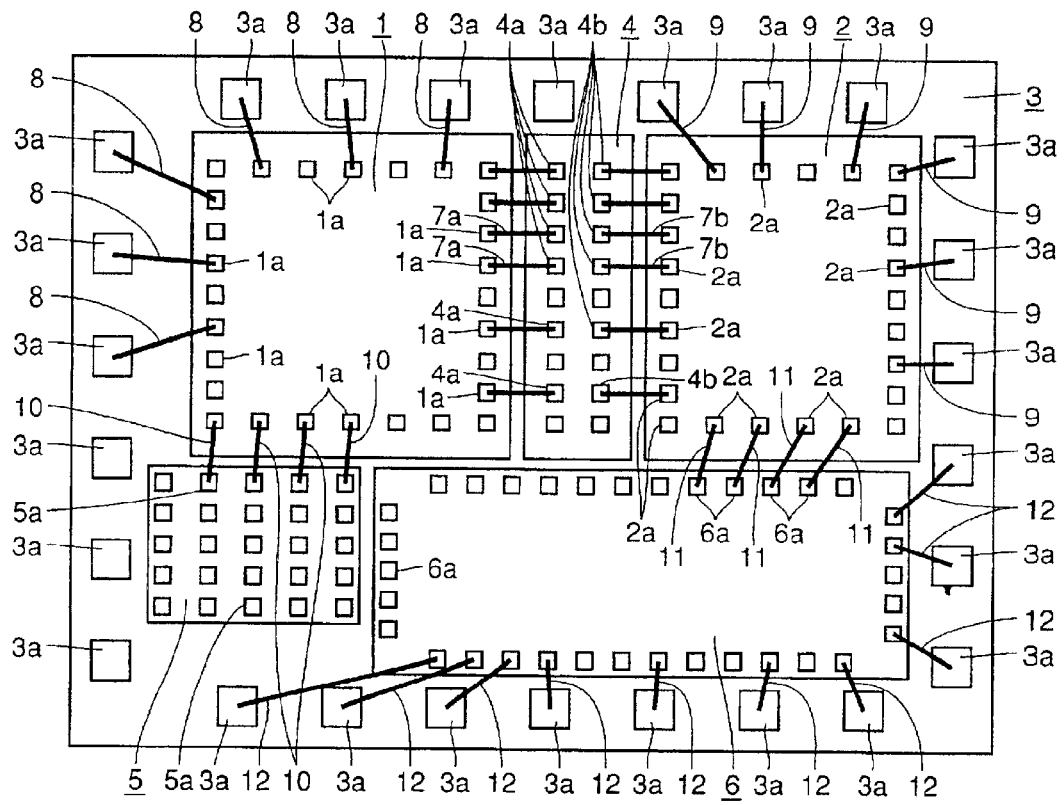
FIG. 1 is a schematic diagram showing a semiconductor device (multi-chip module) according to a first embodiment of the present invention.
Figure 2:
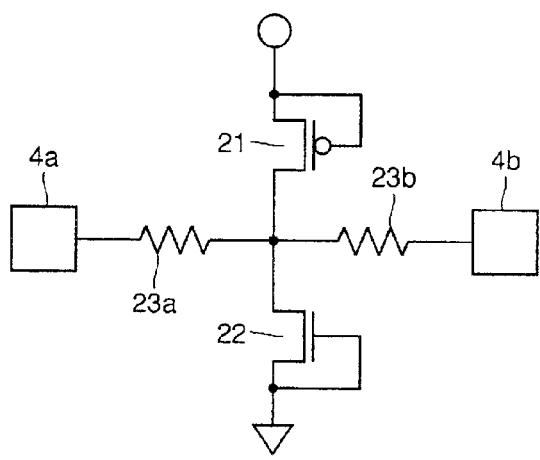
FIG. 2 is a circuit diagram for illustrating the structure of the semiconductor device according to the first embodiment shown in FIG. 1.

Referring to FIG. 1, a DRAM chip 1, a logic chip 2, a chip 4 and other functional chips 5 and 6 are installed on a support substrate 3 consisting of an insulating substrate in the semiconductor device (multi-chip module) according to the first embodiment.

A plurality of input/output terminals 3a are provided on the outer periphery of the surface of the support substrate 3 at prescribed intervals. A plurality of input/output terminals 1a, 2a, 5a and 6a are provided on the upper surfaces of the DRAM chip 1, the logic chip 2 and the chips 5 and 6 respectively. A plurality of input/output terminals 4a and 4b are provided on the upper surface of the chip 4.

The DRAM chip 1 is connected with the support substrate 3 by wires 8, and the logic chip 2 is connected with the support substrate 3 by wires 9. The chip 5 is connected with the DRAM chip 1 by wires 10. The chip 6 is connected with the logic chip 2 and the support substrate 3 by wires 11 and 12 respectively.

According to the first embodiment, the DRAM chip 1 and the logic chip 2 are connected with each other through the chip 4. In other words, the input/output terminals 1a of the DRAM chip 1 and the input/output terminals 4a of the chip 4 are connected with each other by wires 7a. The input/output terminals 2a of the logic chip 2 and the input/output terminals 4b of the chip 4 are connected with each other by wires 7b. The chip 4 is formed with only circuits against static damage and resistors. More specifically, a circuit against static damage consisting of static damage preventive transistors 21 and 22 and resistors 23a and 23b are connected between each input/output terminal 4a and each input/output terminal 4b of the chip 4, as shown in FIG. 2.

The chip 4 including only the resistors 23a and 23b and the circuits against static damage is simpler in structure as compared with the DRAM chip 1 and the logic chip 2. While each of the DRAM chip 1 and the logic chip 2 is formed with five to eight layers of wires through about 20 masks, the chip 4 is formed with about three layers through about 10 masks. Therefore, the chip 4 can be more readily re-formed as compared with the DRAM chip 1 and the logic chip 2.

According to the first embodiment, as hereinabove described, the DRAM chip 1 and the logic chip 2 are connected with each other through the chip 4 having a simple structure including only the resistors 23a and 23b and the circuits against static damage. When timing control for signal transmission is necessary, therefore, the chip 4 may simply be modified for enabling timing control for signal transmission. In this case, the chip 4 having a simple structure can be modified in a short period at a low cost dissimilarly to a case of re-forming the DRAM chip 1 or the logic chip 2. Consequently, the modification period as well as the modification cost can be reduced when timing control for signal transmission is necessary.

According to the first embodiment, further, the chip 4 includes the circuits against static damage, whereby no circuits against static damage may be provided in the DRAM chip 1 and the logic chip 2 but the circuits against static damage included in the chip 4 can be employed as common circuits against static damage for the DRAM chip 1 and the logic chip 2. Thus, the number of the circuits against static damage can be reduced, thereby reducing parasitic capacitances caused by the circuits against static damage. Thus, the signal transmission rate between the DRAM chip 1 and the logic chip 2 can be improved.

According to the first embodiment, no circuits against static damage may be provided in the DRAM chip 1 and the logic chip 2 as described above, whereby the areas of the DRAM chip 1 and the logic chip 2 can be reduced by about 3% to about 20%. Thus, the fabrication cost for the DRAM chip 1 and the logic chip 2 can also be reduced at the same ratio.

Second Embodiment

Figure 3:
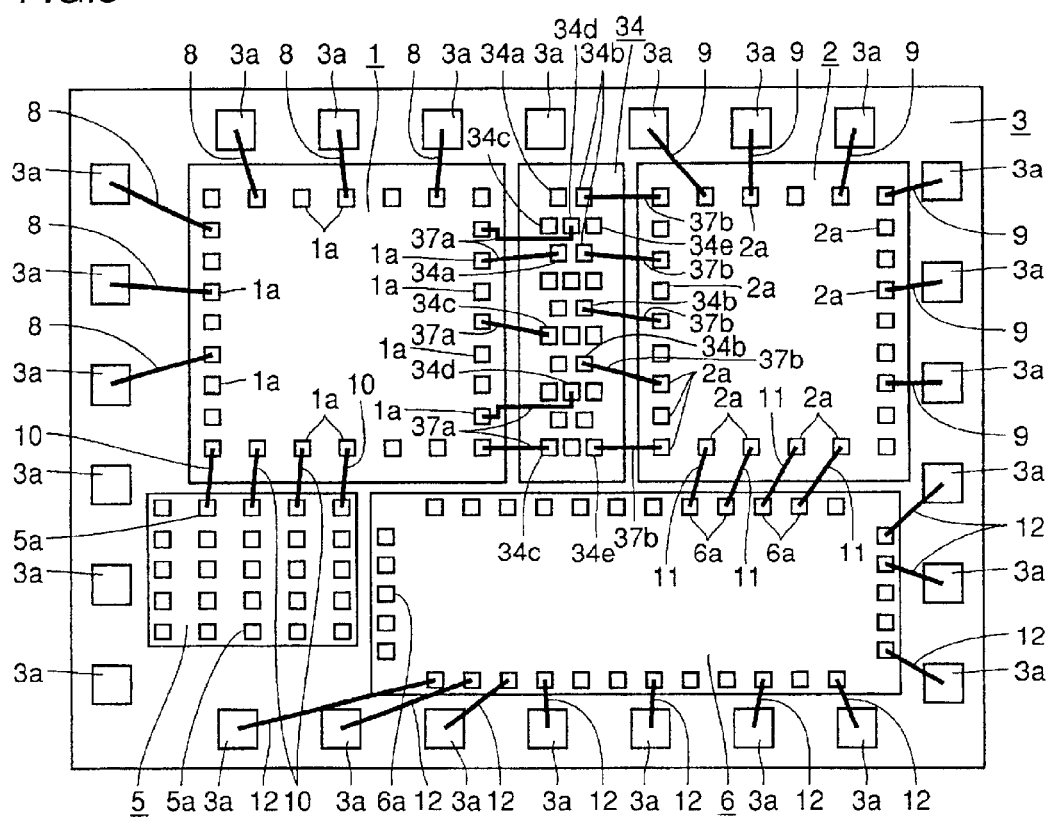
FIG. 3 is a schematic diagram showing a semiconductor device (multi-chip module) according to a second embodiment of the present invention.
Figure 4:
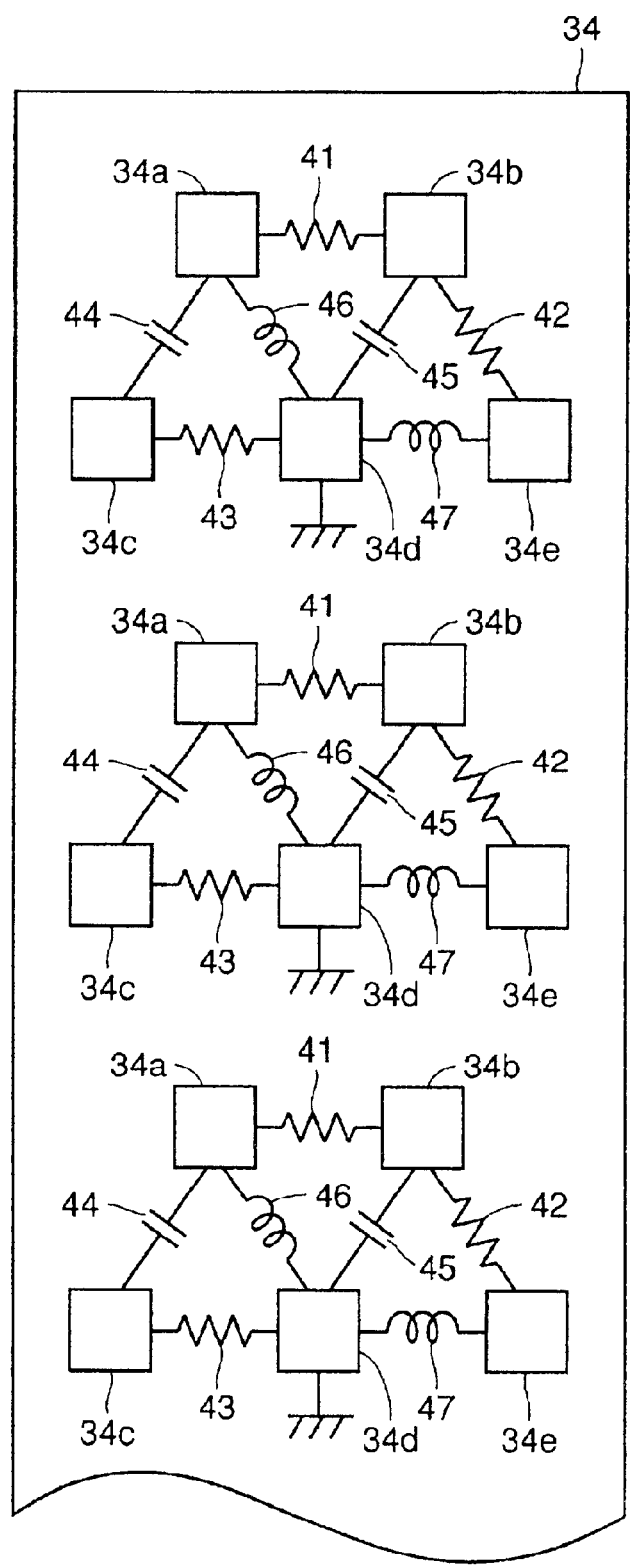
FIG. 4 is a circuit diagram for illustrating the structure of the semiconductor device according to the second embodiment shown in FIG. 3.
Figure 5:
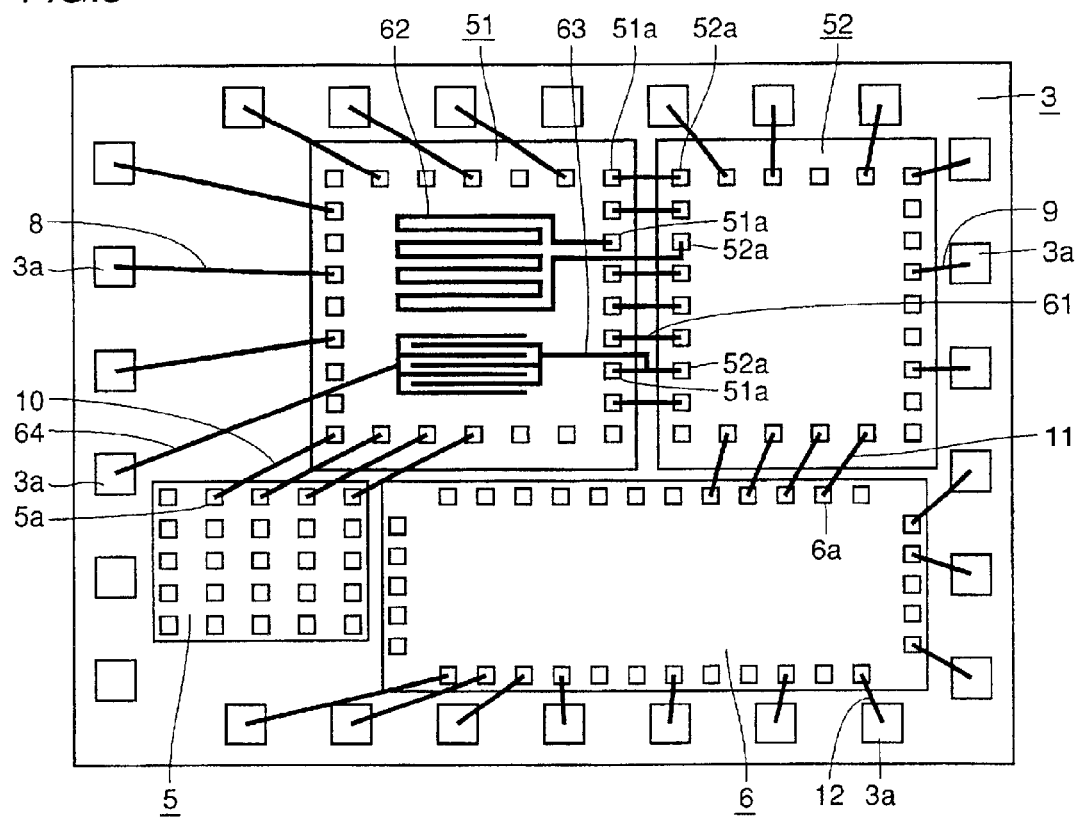
FIG. 5 is a schematic diagram showing a semiconductor device (multi-chip module) according to a third embodiment of the present invention.

Referring to FIGS. 3 and 4, a DRAM chip 1 and a logic chip 2 are connected with each other through a chip 34 including only passive components in a semiconductor device according to a second embodiment of the present invention, dissimilarly to the aforementioned first embodiment. The remaining structure of the second embodiment is similar to that of the first embodiment.

More specifically, the chip 34 is formed to include only resistors 41, 42 and 43, capacitors 44 and 45 and coils (reactors) 46 and 47 in the semiconductor device according to the second embodiment, as shown in FIG. 4.

In this case, the resistors 41, 42 and 43 are connected between input/output terminals 34a and 34b, between input/output terminals 34b and 34e and between input/output terminals 34c and 34d respectively. The capacitors 44 and 45 are connected between the input/output terminals 34a and 34c and between the input/output terminals 34b and 34d respectively. The coils (reactors) 46 and 47 are connected between the input/output terminals 34a and 34d and between the input/output terminals 34d and 34e respectively. The input/output terminals 34d are grounded.

The DRAM chip 1 and the logic chip 2 are connected with each other through the chip 34 having the aforementioned structure. At this time, wires 37a and 37b shown in FIG. 3 are connected to those selected from the input/output terminals 34a to 34e, so that necessary passive components can be selected in response to the type of a signal.

The chip 34 is formed in about a single layer or two layers through about three masks. Thus, the chip 34 is simpler in structure than the chip 4 according to the first embodiment including the circuits against static damage and passive components.

According to the second embodiment, the chip 34 including only the passive components, i.e., the resistors 41, 42 and 43, the capacitors 44 a 45 and the coils (reactors) 46 and 47 is simpler in structure than the chip 4 according to the first embodiment as hereinabove described, whereby a modification period as well as a modification cost for the chip 34 can be further reduced as compared with the first embodiment when timing control for signal transmission is necessary.

Third Embodiment

In a semiconductor device according to a third embodiment of the present invention, wires for connecting semiconductor chips with each other are provided with passive component functions, thereby performing timing control for signal transmission. The third embodiment is now described in detail.

Figure 6:
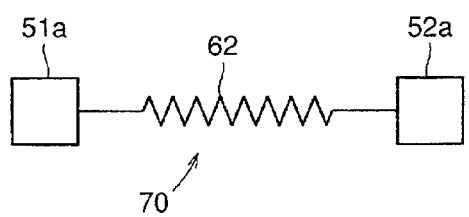
FIGS. 6 and 7 are circuit diagrams for illustrating the structure of the semiconductor device according to the third embodiment shown in FIG. 5.

In the semiconductor device according to the third embodiment, input/output terminals 51a of a DRAM chip 51 and input/output terminals 52a of a logic chip 52 are connected with each other by wires 61, 62 and 63. The wire 61 linearly connects the input/output terminals 51a and 52a with the minimum distance. On the other hand, the wire 62 connects the input/output terminals 51a and 52a with a length of about 10 times that of the wire 61. The wire 62 is formed so long as to define a resistor 70, as shown in FIG. 6.

Figure 7:
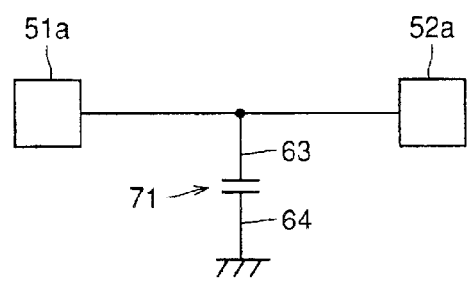

The wire 63 connecting the input/output terminals 51a and 52a has three branch portions on the forward end thereof. A dummy wire 64 is provided with four branch portions arranged to be opposed to the three branch portions of the wire 63 at a prescribed interval. The dummy wire 64 is connected to an input/output terminal 3a of a support substrate 3, to be fixed to a prescribed potential. The wire 63 and the dummy wire 64 are combined with each other to form a capacitor 71 shown in FIG. 7.

According to the third embodiment, the wire 62 has the function of a resistor while the wire 63 has the function of a capacitor as hereinabove described, whereby the signal transmission rate between the DRAM chip 51 and the logic chip 52 can be adjusted only through a wiring step after completely fabricating the DRAM chip 51 and the logic chip 52. Further, the signal transmission rate between the chips can be adjusted only through the low-priced wiring step without re-fabricating the fine DRAM chip 51 or logic chip 52 requiring a high fabrication cost.

According to the third embodiment, further, the signal transmission rate between the chips can be readily adjusted due to the resistor function of the wire 62 and the capacitor function of the wire 63.

Fourth Embodiment

A semiconductor device according to a fourth embodiment of the present invention is now described with reference to FIGS. 8 to 11.

Figure 8:
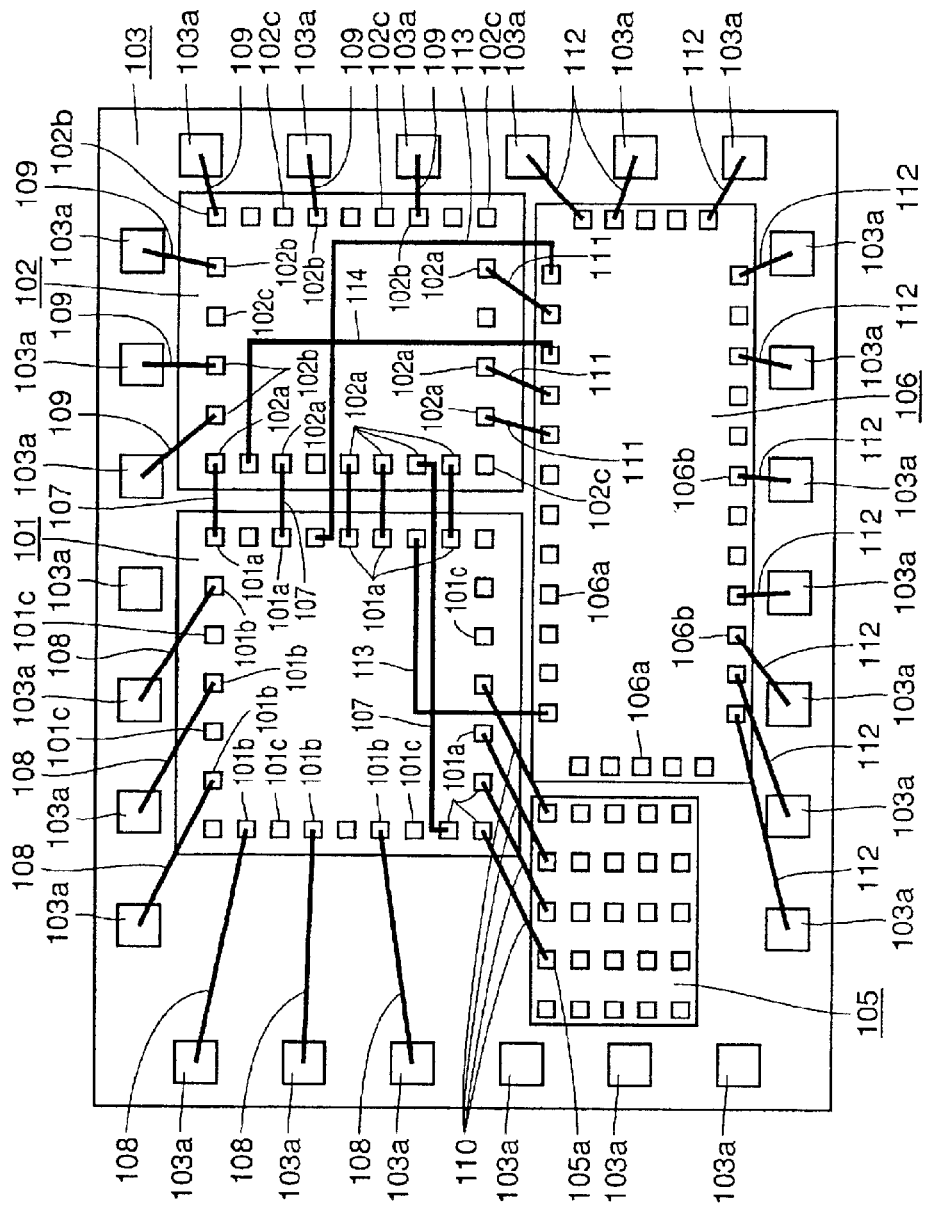
FIG. 8 is a schematic diagram showing a semiconductor device (multi-chip module) according to a fourth embodiment of the present invention.

FIG. 8 is a schematic diagram of the semiconductor device according to the fourth embodiment. Referring to FIG. 8, a DRAM chip 101, a logic chip 102 and other functional chips 105 and 106 are installed on a support substrate 103 consisting of an insulating substrate in the semiconductor device (multi-chip module) according to the fourth embodiment.

A plurality of input/output terminals 103a are provided on the outer periphery of the surface of the support substrate 103 at prescribed intervals. A plurality of input/output terminals 101a, 101b, 101c, 102a, 102b, 102c, 105a and 106a are provided on the upper surfaces of the DRAM chip 101, the logic chip 102 and the chips 105 and 106 respectively.

The input/output terminals 101b and 102b are employed for connection with the support substrate 103. The input/output terminals 101c and 102c are employed for testing individual operating states of the chips after completion of the chips. The input/output terminals 101a and 102a are other than the aforementioned input/output terminals 101b, 102b, 101c and 102c for connection with the substrate 103 and testing.

Figure 9:
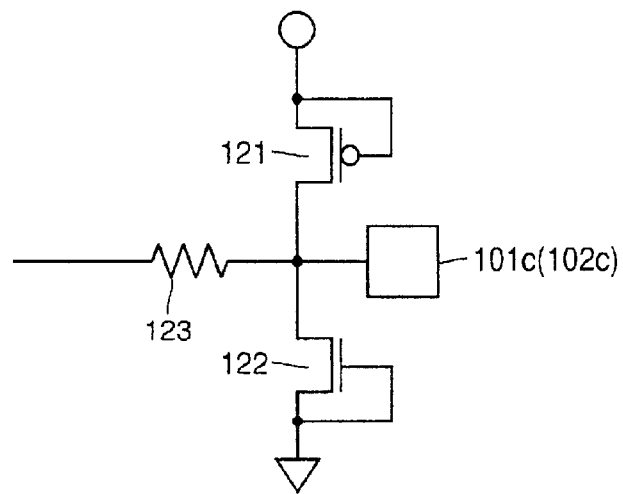
FIGS. 9 to 11 are circuit diagrams for illustrating the structure of the semiconductor device (multi-chip module) according to the fourth embodiment shown in FIG. 8.
Figure 10:
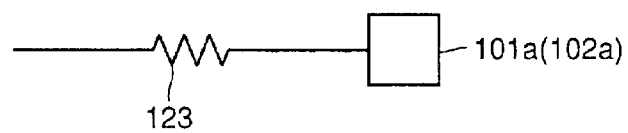
Figure 11:
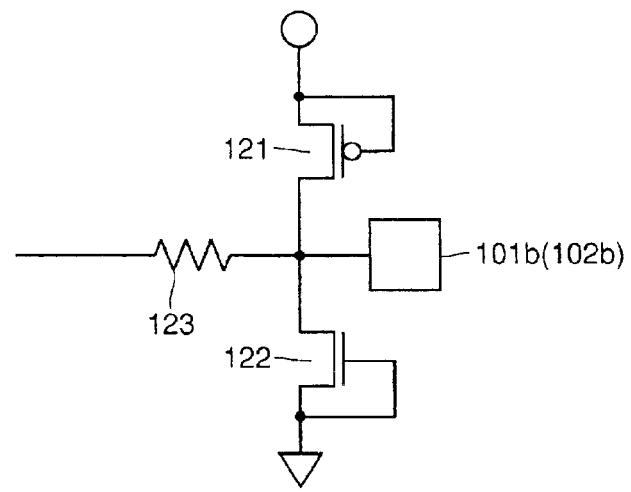

FIGS. 9 to 11 are circuit diagrams of the semiconductor device according to the fourth embodiment. According to the fourth embodiment, a circuit against static damage consisting of static damage preventive transistors 121 and 122 and a resistor 123 are connected to each of the input/output terminals 101c and 102c for testing, as shown in FIG. 9. A circuit against static damage consisting of static damage preventive transistors 121 and 122 and a resistor 123 are connected also to each of the input/output terminals 101b and 102b for connection with the support substrate 103, as shown in FIG. 11.

On the other hand, no static damage preventive transistors are connected but only a resistor 123 is connected to each of the input/output terminals 101a and 102a other than those for testing and connection with the support substrate 103, as shown in FIG. 10. According to the fourth embodiment, the input/output terminals 101a and 102a connected with no static damage preventive transistors are employed for connecting the DRAM chip 101 and the logic chip 102 with each other. In other words, the input/output terminals 101a of the DRAM chip 101 and the input/output terminals 102a of the logic chip 102 are connected with each to other by wires 107.

The DRAM chip 101 and the chip 105 are connected with each other by wires 110, while the DRAM chip 101 and the chip 106 are connected with each other by wires 113. The input/output terminals 101b of the DRAM chip 101 are connected with the input/output terminals 103a of the support substrate 103 by wires 108, while the input/output terminals 102b of the logic chip 102 are connected with the input/output terminals 103a of the support substrate 103 by wires 109. The input/output terminals 106b of the chip 106 are connected with the input/output terminals 103a of the support substrate 103 by wires 112. The wires employed in the fourth embodiment have a two-layer structure, as shown in FIG. 8.

According to the fourth embodiment, the DRAM chip 101 and the logic chip 102 are connected with each other through the input/output terminals 101a and 102a other than those for testing and connection with the support substrate 103 as described above, whereby parasitic capacitances of the circuits against static damage for testing and connection with the support substrate 103 can be eliminated from the path between the DRAM chip 101 and the logic chip 102. In addition, the input/output terminals 101a and 102a include no circuits against static damage, whereby parasitic capacitances of circuits against static damage can be completely eliminated from the path between the DRAM chip 101 and the logic chip 102. Consequently, the signal transmission rate between the DRAM chip 101 and the logic chip 102 can be improved.

Static damage readily takes place in testing and after completion of the semiconductor device, and hence no significant problem arises also when no circuits against static damage are connected to the input/output terminals 101a and 102a other than those for testing and connection with the support substrate 103.

According to the fourth embodiment, no circuits against static damage are connected to the input/output terminals 101a and 102a as described above, whereby the areas of the DRAM chip 101 and the logic chip 102 can be reduced. Thus, the fabrication cost for the DRAM chip 101 and the logic chip 102 can also be reduced.

Fifth Embodiment

Referring to FIGS. 12 to 15, chips are connected with each other through input/output terminals including circuits against static damage consisting of static damage preventive transistors having a small gate electrode width in a semiconductor device according to a fifth embodiment of the present invention, dissimilarly to the aforementioned fourth embodiment. The remaining structure of the fifth embodiment is substantially similar to that of the fourth embodiment.

Figure 12:
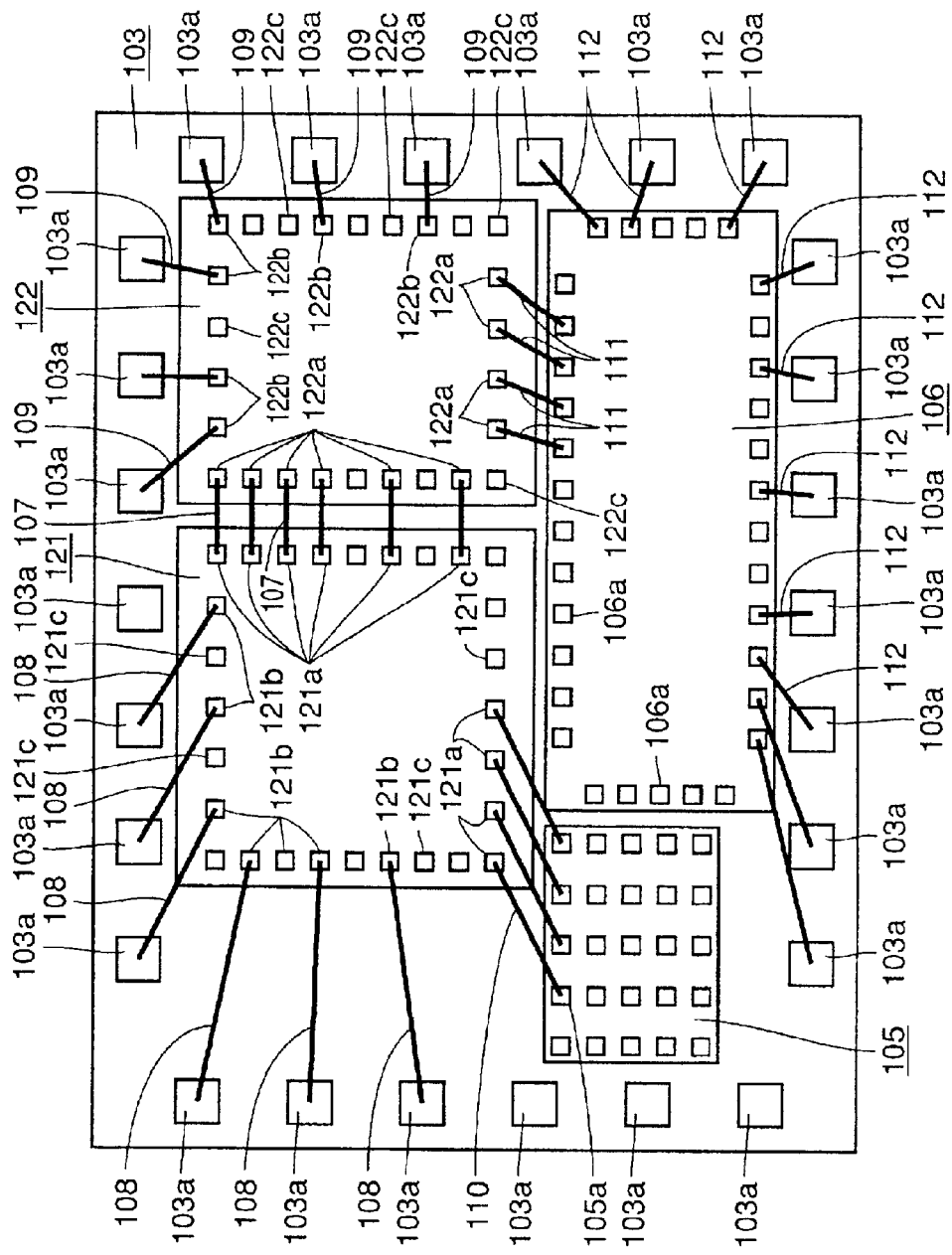
FIG. 12 is a schematic diagram showing a semiconductor device (multi-chip module) according to a fifth embodiment of the present invention.

FIG. 12 is a schematic diagram of the structure of the semiconductor device according to the fifth embodiment. More specifically, a DRAM chip 121, a logic chip 122 and other functional chips 105 and 106 are installed on a support substrate 103 consisting of an insulating substrate in the semiconductor device according to the fifth embodiment, as shown in FIG. 12. A plurality of input/output terminals 121a, 121b, 121c, 122a, 122b and 122c are provided on the upper surfaces of the DRAM chip 121 and the logic chip 122 respectively.

The input/output terminals 121b and 122b are employed for connection with the support substrate 103. The input/output terminals 121c and 122c are employed for a test for confirming individual operating states of the chips after completion of the chips. The input/output terminals 121a and 122a are other than those for testing and connection with the support substrate 103.

Figure 13:
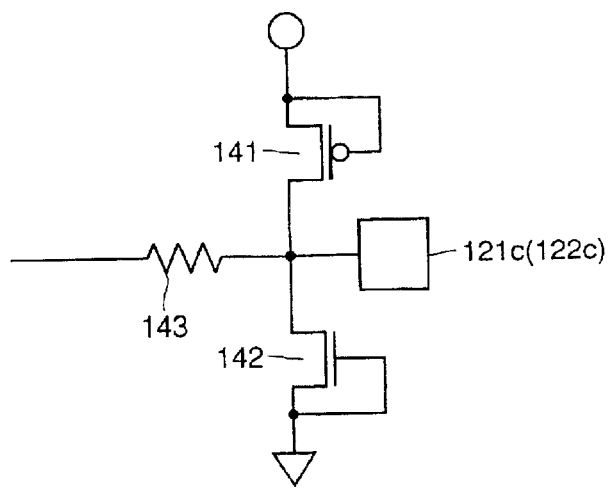
FIGS. 13 to 15 are circuit diagrams for illustrating the structure of the semiconductor device (multi-chip module) according to the fifth embodiment shown in FIG. 12.
Figure 14:
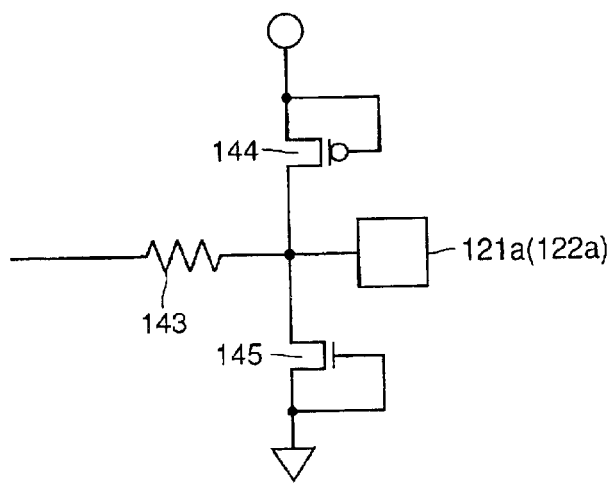
Figure 15:
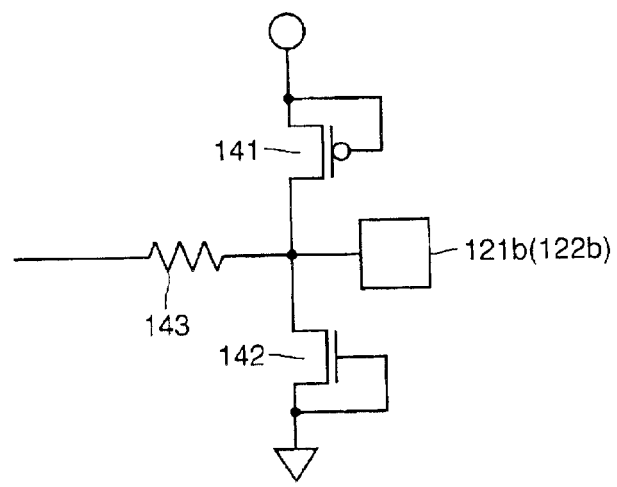

FIGS. 13 to 15 are circuit diagrams of the semiconductor device according to the fifth embodiment. According to the fifth embodiment, a circuit against static damage consisting of static damage preventive transistors 141 and 142 and a resistor 143 are connected to each of the input/output terminals 121c and 122c for testing, as shown in FIG. 13. A circuit against static damage consisting of static damage preventive transistors 141 and 142 and a resistor 143 are connected also to each of the input/output terminal 121b and 122b for connection with the support substrate 103, as shown in FIG. 15.

On the other hand, a circuit against static damage consisting of static damage preventive transistors 144 and 145 smaller in size than the static damage preventive transistors 141 and 142 are connected to each of the input/output terminals 121a and 122a other than those for testing and connection with the support substrate 103, as shown in FIG. 14. In other words, gate electrodes forming the static damage preventive transistors 144 and 145 are rendered smaller in width than those forming the static damage preventive transistors 141 and 142.

According to the fifth embodiment, the DRAM chip 121 and the logic chip 122 are connected with each other through the input/output terminal 121a and 122a connected with the aforementioned static damage preventive transistors 144 and 145 having a small gate electrode width. In other words, the input/output terminals 121a of the DRAM chip 121 and the input/output terminals 122a of the logic chip 122 are connected with each other by wires 107.

According to the fifth embodiment, the DRAM chip 121 and the logic chip 122 are connected with each other through the input/output terminal 121a and 122a including the static damage preventive transistors 144 and 145 having a small gate electrode width, whereby parasitic capacitances of the circuits against static damage can be reduced in the path between the DRAM chip 121 and the logic chip 122. Consequently, the signal transmission rate between the chips can be improved.

Static damage readily takes place in testing and after completion of the semiconductor device, and hence no significant problem arises also when the input/output terminals 101a and 102a other than those for testing and connection with the support substrate 103 have small circuits against static damage.

According to the fifth embodiment, further, the static damage preventive transistors 144 and 145 having a small gate electrode width are connected to the input/output terminal 121a and 122a as hereinabove described, whereby the areas of the DRAM chip 121 and the logic chip 122 can be reduced.

Sixth Embodiment

In a semiconductor device according to a sixth embodiment of the present invention, chips are connected with each other through input/output terminals including circuits against static damage consisting of diodes, dissimilarly to the aforementioned fourth and fifth embodiments. The remaining structure of the sixth embodiment is substantially similar to that of the fifth embodiment.

Figure 16:
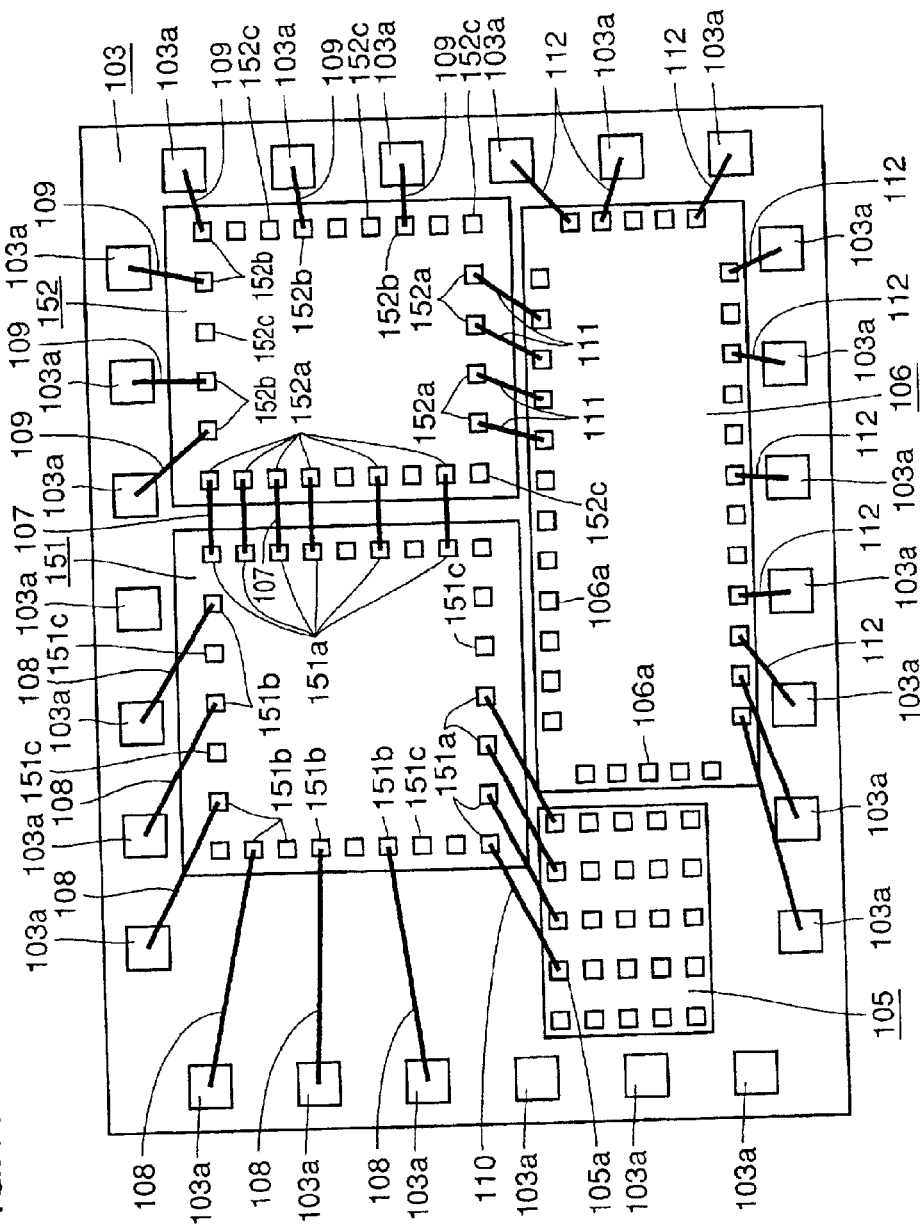
FIG. 16 is a schematic diagram showing a semiconductor device (multi-chip module) according to a sixth embodiment of the present invention.

FIG. 16 is a schematic diagram of the semiconductor device according to the sixth embodiment. More specifically, a DRAM chip 151, a logic chip 152 and other functional chips 105 and 106 are installed on a support substrate 103 consisting of an insulating substrate in the semiconductor device according to the sixth embodiment, as shown in FIG. 16. A plurality of input/output terminals 151a, 151b, 151c, 152a, 152b and 152c are provided on the upper surfaces of the DRAM chip 151 and the logic chip 152 respectively.

The input/output terminals 151b and 152b are employed for connection with the support substrate 103. The input/output terminals 151c and 152c are employed for a test for confirming individual operating states of the chips after completion of the chips. The input/output terminal 151a and 152a are other than those for testing and connection with the support substrate 103.

Figure 17:
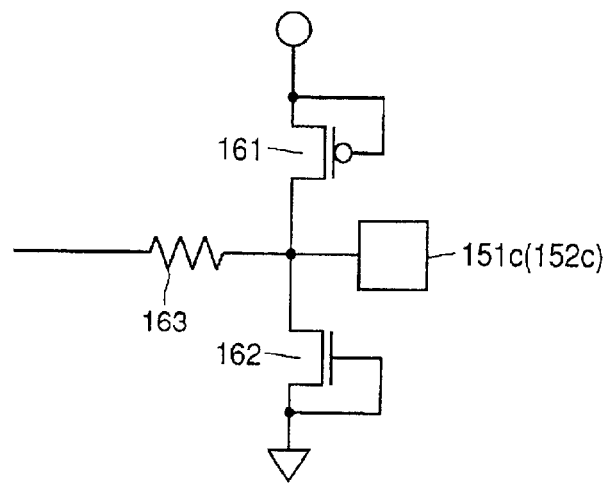
FIGS. 17 to 19 are circuit diagrams for illustrating the structure of the semiconductor device (multi-chip module) according to the sixth embodiment shown in FIG. 16.
Figure 18:
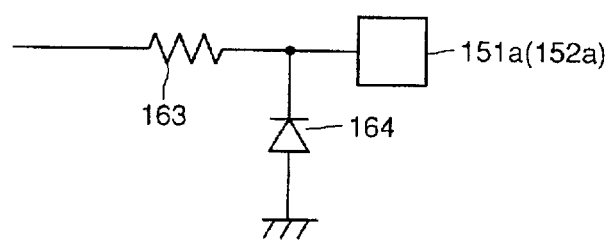
Figure 19:
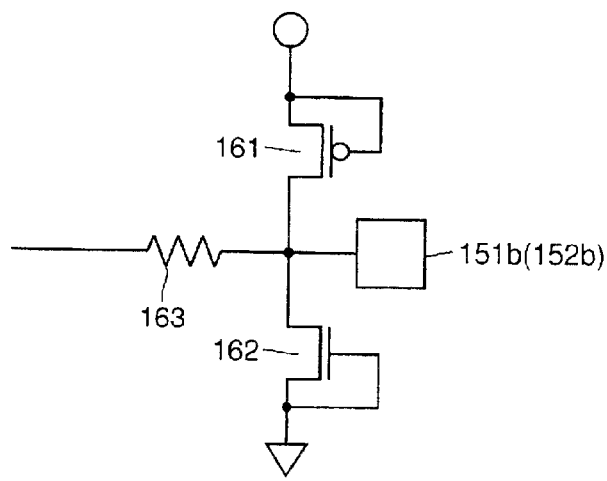

FIGS. 17 to 19 are circuit diagrams of the semiconductor device according to the sixth embodiment. According to the sixth embodiment, a circuit against static damage consisting of static damage preventive transistors 161 and 162 and a resistor 163 are connected to each of the input/output terminals 151c and 152c for testing, as shown in FIG. 17. A circuit against static damage consisting of static damage preventive transistors 161 and 162 and a resistor 163 are connected also to each of the input/output terminals 151b and 152b for connection with the support substrate 103, as shown in FIG. 19.

On the other hand, a circuit against static damage consisting of a diode 164 and a resistor 163 are connected to each of the input/output terminals 151a and 152a other than those for testing and connection with the support substrate 103, as shown in FIG. 18. The circuit against static damage consisting of the diode 164 has a smaller element area, a smaller parasitic capacitance and lower tolerance as compared with the circuit against static damage consisting of the static damage preventive transistors 161 and 162.

According to the sixth embodiment, the DRAM chip 151 and the logic chip 152 are connected with each other through the input/output terminals 151a and 152a connected with the circuits against static damage consisting of the diodes 164. In other words, the input/output terminals 151a of the DRAM chip 151 and the input/output terminals 152a of the logic chip 152 are connected with each other by wires 107.

According to the sixth embodiment, the DRAM chip 151 and the logic chip 152 are connected with each other through the input/output terminals 151a and 152a including the circuits against static damage consisting of the diodes 164 having small parasitic capacitances as described above, whereby parasitic capacitances of the circuits against static damage can be reduced in the path between the DRAM chip 151 and the logic chip 152. Consequently, the signal transmission rate between the DRAM chip 151 and the logic chip 152 can be improved.

Static damage readily takes place in testing and after completion of the semiconductor device, and hence no significant problem arises also when the circuits against static damage for the input/output terminals 151a and 152a other than those for testing and connection with the support substrate 103 are formed by the diodes 164 having low tolerance.

According to the sixth embodiment, the circuits against static damage consisting of the diodes 164 having small element areas are connected to the input/output terminals 151a and 152a as described above, whereby the areas of the DRAM chip 151 and the logic chip 152 can be reduced.

Seventh Embodiment

A semiconductor device according to a seventh embodiment of the present invention is provided with a switch for turning on/off a circuit against static damage for an input/output terminal, dissimilarly to the aforementioned fourth to sixth embodiments.

Figure 20:
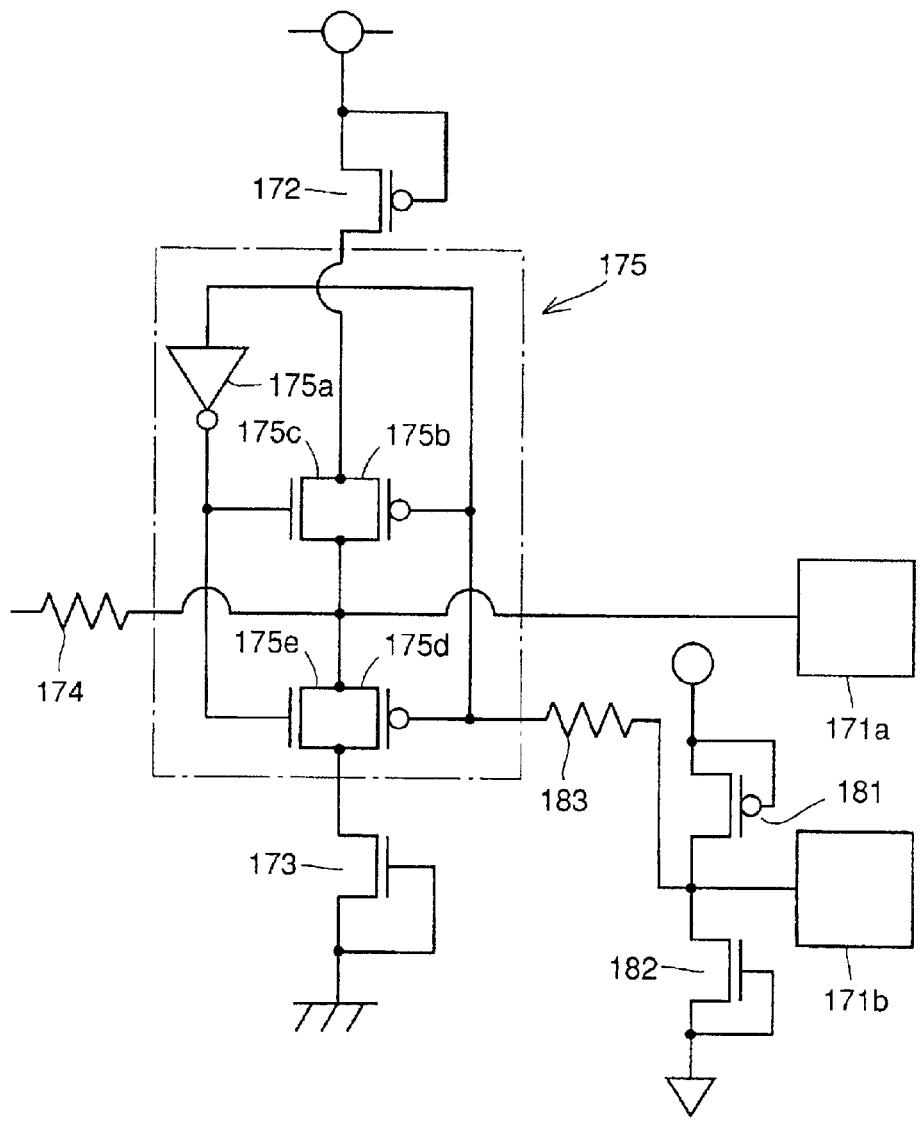
FIG. 20 is a circuit diagram for illustrating the structure of a semiconductor device (multi-chip module) according to a seventh embodiment of the present invention.

FIG. 20 is a circuit diagram of the semiconductor device according to the seventh embodiment. More specifically, a circuit against static damage consisting of static damage preventive transistors 172 and 173 and a resistor 174 are connected to an input/output terminal 171a in the semiconductor device according to the seventh embodiment, as shown in FIG. 20. A static damage preventive switch 175 is connected between the input/output terminal 171a and the circuit against static damage consisting of the static damage preventive transistors 172 and 173. A switch control input/output terminal 171b is connected to the static damage preventive switch 175, for externally on-off controlling the static damage preventive switch 175.

The static damage preventive switch 175 includes an inverter 175a, a P-channel transistor 175b and an N-channel transistor 175c, as well as a P-channel transistor 175d and an N-channel transistor 175e. Sources and drains of the P-channel transistor 175b and the N-channel transistor 175c are connected with each other. sources and drains of the P-channel transistor 175d and the N-channel transistor 175e are connected with each other.

The inverter 175a is arranged on a path reaching the N-channel transistors 175c and 175e from the switch control input/output terminal 171b, and inverts a voltage applied to the switch control input/output terminal 171b. The P-channel transistor 175b and the N-channel transistor 175c are connected between the static damage preventive transistor 172 and the input/output terminal 171a, while the P-channel transistor 175d and the N-channel transistor 175e are connected between the static damage preventive transistor 173 and the input/output terminal 171a.

A circuit against static damage consisting of static damage preventive transistors 181 and 182 and a resistor 183 are connected between the switch control input/output terminal 171b and the static damage preventive switch 175.

In operation of the semiconductor device according to the seventh embodiment, no voltage is applied to the switch control input/output terminal 171b during a step of fabricating chips requiring a countermeasure against static damage. When a positive transient voltage is externally input in the input/output terminal 171a, the P-channel transistors 175b and 175d enter ON states. When a negative transient voltage is externally input in the input/output terminal 171a, the N-channel transistors 175c and 175e enter ON states. Thus, the circuit against static damage consisting of the static damage preventive transistors 172 and 173 is turned on in either case.

After completion of a chip connection step following fabrication of semiconductor chips, a supply voltage (VDD) is applied to the switch control input/output terminal 171b thereby bringing the P-channel transistors 175b and 175d into OFF states while fixing the N-channel transistors 175c and 175e also to OFF states. Thus, the circuit against static damage consisting of the static damage preventive transistors 172 and 173 enters an OFF state.

According to the seventh embodiment, as hereinabove described, the circuit against static damage consisting of the static damage preventive transistors 172 and 173 can be turned on in the step of fabricating the semiconductor chips requiring a countermeasure against static damage while the circuit against static damage can be turned off after termination of the chip connection step following completion of the chips requiring no countermeasure against static damage. Thus, a parasitic capacitance of the circuit against static damage can be eliminated after termination of the chip connection step, whereby a signal transmission rate can be improved.

According to the seventh embodiment, the circuit against static damage consisting of the static damage preventive transistors 181 and 182 is connected to the switch control input/output terminal 171b as described above, whereby the switch control input/output terminal 171b can also be effectively prevented from static damage.

Figure 21:
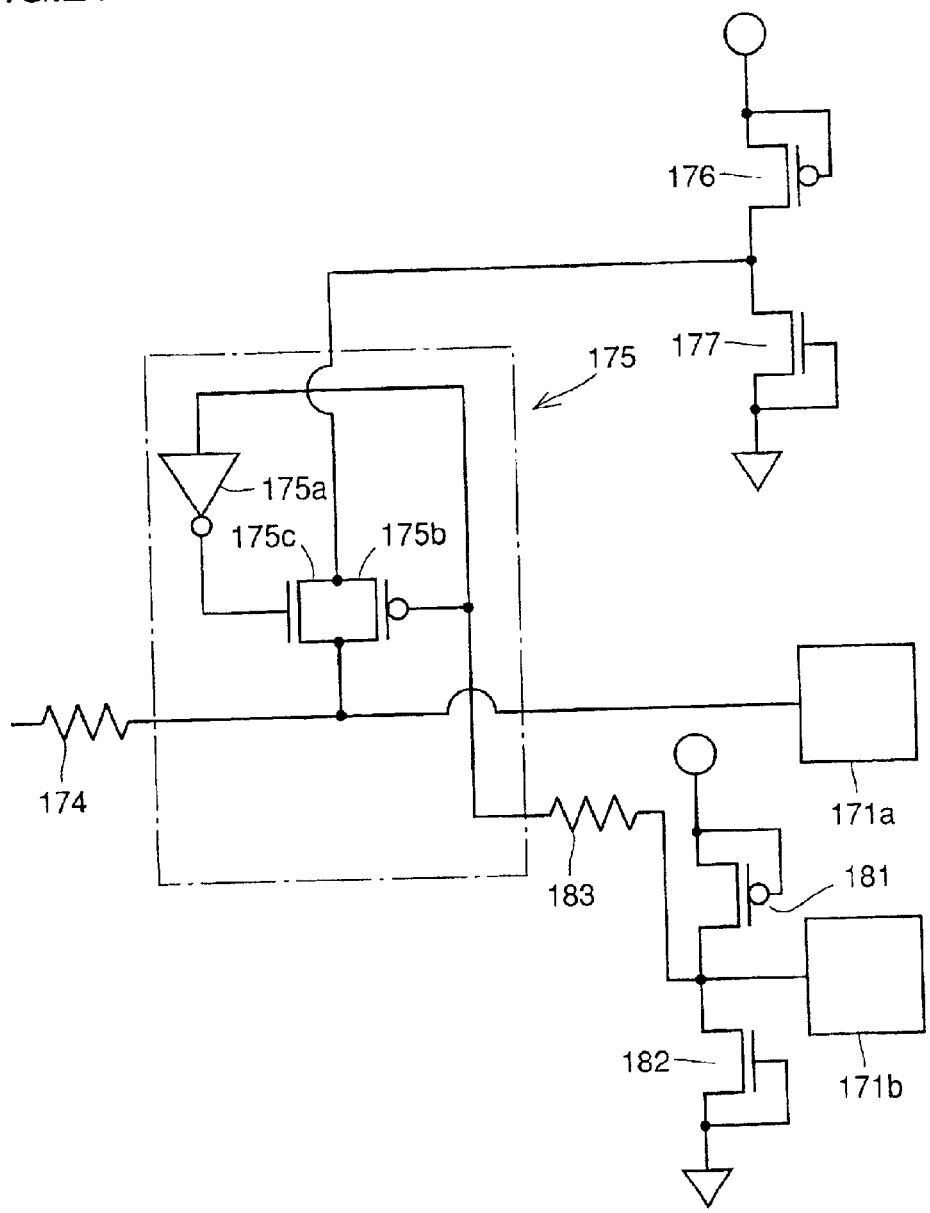
FIG. 21 is a circuit diagram for illustrating the structure of a semiconductor device (multi-chip module) according to a modification of the seventh embodiment of the present invention.
Figure 22:
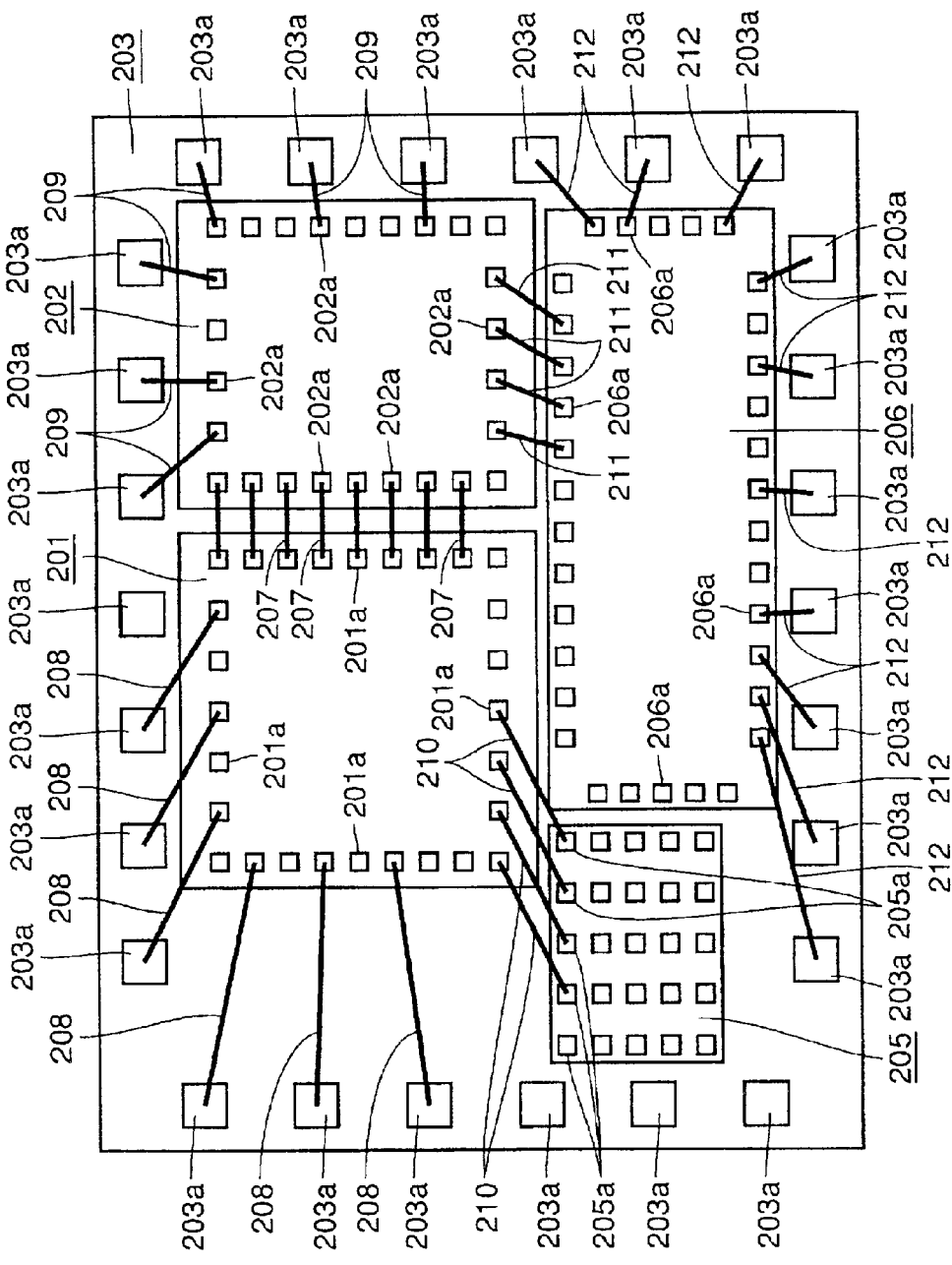
FIG. 22 is a schematic diagram showing a conventional semiconductor device (multi-chip module)
Figure 23:
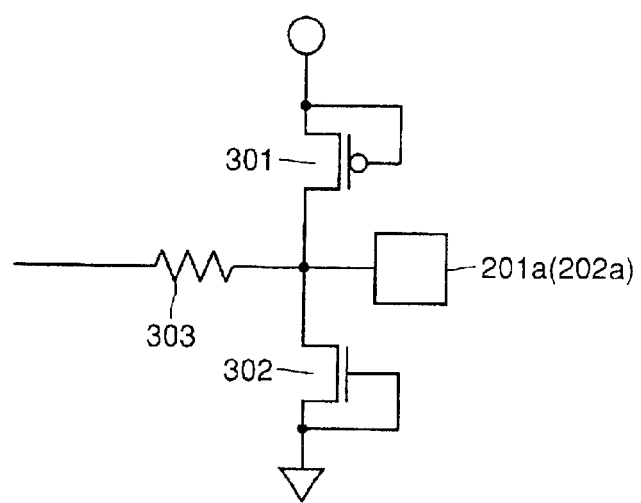
FIG. 23 is a circuit diagram showing the structure of an input/output circuit of a semiconductor chip in the conventional semiconductor device (multi-chip module) shown in FIG. 22.

FIG. 21 is a circuit diagram of a semiconductor device according to a modification of the seventh embodiment. Referring to FIG. 21, a static damage preventive switch 175 is provided for turning on/off a circuit against static damage, consisting of static damage preventive transistors 176 and 177, for an input/output terminal 171a in the modification of the seventh embodiment, similarly to the seventh embodiment shown in FIG. 20.

While the static damage preventive switch 175 is formed by the four transistors 175b, 175c, 175d and 175e in the seventh embodiment shown in FIG. 20, the static damage preventive switch 175 is formed by two transistors 175b and 175c in the modification of the seventh embodiment shown in FIG. 21. Thus, the parasitic capacitance can be further reduced.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned first to seventh embodiments is applied to the case of arranging chips having different functions on the same plane, the present invention is not restricted to this but is also applicable to a case of vertically arranging chips having different functions.

While the wires have a first-layer or second-layer structure after completion of the chips in each of the aforementioned first to seventh embodiments, the present invention is not restricted to this but is also applicable to a case of employing wires having three or more layers, to attain a similar effect.

What is claimed is:

1. A semiconductor device comprising:
a plurality of semiconductor chips installed on a support substrate;
a first wire connecting first terminals of said plurality of semiconductor chips with each other and having a passive component function; and
wherein said wire having a passive component function has a length greater than a second wire for linearly connecting second terminals of said plurality of semiconductor chips with each other whereby said first wire forms a resistive element.

2. A semiconductor device comprising:
a plurality of semiconductor chips installed on a support substrate;
a wire connecting said plurality of semiconductor chips with each other and having a passive component function; and
a dummy wire fixed to a prescribed potential and arranged to be opposed to said wire at a prescribed interval, wherein said wire is combined with said dummy wire to form a capacitor.

3. The semiconductor device according to claim 1, wherein
said wire is formed either in a single layer or in two layers.

4. A semiconductor device having a plurality of semiconductor chips installed on a support substrate, wherein
at least one of said semiconductor chips includes:
a first input/output terminal, employed for testing an independent operating state of said semiconductor chip, having a first circuit against static damage,
a second input/output terminal, employed for connecting said semiconductor chip to said support substrate, having a second circuit against static damage, and
a third input/output terminal other than said first input/output terminal and said second input/output terminal, and
said plurality of semiconductor chips are connected with each other through said third input/output terminal.

5. The semiconductor device according to claim 4, wherein
said third input/output terminal includes no circuit against static damage.

6. The semiconductor device according to claim 5, wherein
said third input/output terminal includes only a resistor.

7. The semiconductor device according to claim 4, wherein
said third input/output terminal includes a third circuit against static damage, and
a transistor forming said third circuit against static damage is smaller than transistors forming said first and second circuits against static damage.

8. The semiconductor device according to claim 7, wherein
the gate width of said transistor forming said third circuit against static damage is smaller than the gate width of said transistors forming said first and second circuits against static damage.

9. The semiconductor device according to claim 4, wherein
said third input/output terminal includes a third circuit against static damage,
said third circuit against static damage is formed by a diode, and
said first and second circuits against static damage are formed by transistors.

10. The semiconductor device according to claim 4, wherein
said plurality of semiconductor chips include a DRAM chip and a logic chip.

11. A semiconductor device having a plurality of semiconductor chips installed on a support substrate, wherein
at least one of said semiconductor chips includes:
a first input/output terminal and a second input/output terminal,
a first circuit against static damage connected to said first input/output terminal, and
switching means connected between said first input/output terminal and said first circuit against static damage and on-off controlled by said second input/output terminal.

12. The semiconductor device according to claim 11, wherein
said switching means is set to an ON state by applying no voltage to said second input/output terminal during a step of fabricating said semiconductor chips and set to an OFF state by applying a prescribed voltage to said second input/output terminal after completion of a chip connection step following fabrication of said semiconductor chips.

13. The semiconductor device according to claim 11, wherein said first circuit against static damage includes first and second transistors, and said switching means includes:
a third transistor connected between said first transistor and said first input/output terminal to enter an ON state when no voltage is applied to said second input/output terminal and enter an OFF state when said prescribed voltage is applied to said second input/output terminal, and a fourth transistor connected between said second transistor and said first input/output terminal to enter an ON state when no voltage is applied to said second input/output terminal and enter an OFF state when said prescribed voltage is applied to said second input/output terminal.

14. The semiconductor device according to claim 11, wherein a second circuit against static damage is connected to said second input/output terminal.

15. A semiconductor device comprising:

a first semiconductor chip installed on a support substrate, consisting of only a passive component for controlling timing for signal transmission and having a plurality of input/output terminals, a second semiconductor chip and a third semiconductor chip installed on said support substrate and having an individual function, respectively, wherein said second semiconductor chip and said third semiconductor chip are connected with each other through said first semiconductor chip by connecting selected ones of said plurality of input/output terminals of said first semiconductor chip, respectively.

16. A semiconductor device according to claim 15, wherein said passive component for controlling timing includes a first passive subcomponent and a second passive subcomponent, said plurality of input/output terminals of said first semiconductor chip include a first input/output terminal, a second input/output terminal and a third input/output terminal, said first passive sub-component is connected between said first input/output terminal and said second input/output terminal, and said second passive sub-component is connected between said first input/output terminal and said third input/output terminal.

17. A semiconductor device according to claim 15, wherein said passive component for controlling timing includes a first passive subcomponent and a second passive subcomponent of similar circuit elements, said plurality of input/output terminal of said first semiconductor chip include a first input/output terminal, a second input/output terminal and a third input/output terminal, said first passive sub-component is connected between said first input/output terminal and said second input/output terminal, and said second passive sub-component is connected between said first input/output terminal and said third input/output terminal.

18. A semiconductor device according to claim 15, wherein said passive component for controlling timing includes a resistor, a capacitor and a reactor.

* * * * *